(12) United States Patent
Shimizu et al.

(10) Patent No.: US 6,521,354 B1
(45) Date of Patent: Feb. 18, 2003

(54) EPOXY RESIN COMPOSITION AND SEMICONDUCTOR DEVICE

(75) Inventors: Hiroo Shimizu, Nagoya (JP); Katsuhiro Niwa, Nagoya (JP); Masayuki Tanaka, Nagoya (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 09/806,733

(22) PCT Filed: Aug. 2, 2000

(86) PCT No.: PCT/JP00/05163

§ 371 (c)(1),
(2), (4) Date: Apr. 4, 2001

(87) PCT Pub. No.: WO01/10955

PCT Pub. Date: Feb. 15, 2001

(30) Foreign Application Priority Data

Aug. 6, 1999 (JP) ............................................ 11-223323

(51) Int. Cl.[7] .............................................. H01L 29/12
(52) U.S. Cl. ...................... 428/620; 257/786; 257/789; 257/793; 257/795; 523/443; 525/523; 528/121
(58) Field of Search ........................ 523/443; 525/523; 528/121; 257/788, 789, 793, 795; 428/620

(56) References Cited

U.S. PATENT DOCUMENTS

| 536,087 A | | 3/1895 | Kreps | |
|---|---|---|---|---|
| 5,798,400 A | * | 8/1998 | Tokunaga | .................. 523/443 |
| 6,177,489 B1 | * | 1/2001 | Okuse | .................. 523/451 |

FOREIGN PATENT DOCUMENTS

| DE | 19800178 | | 7/1998 |
|---|---|---|---|
| EP | 0384707 | | 8/1990 |
| EP | 0450944 | | 10/1991 |
| JP | 2-218736 | | 8/1990 |
| JP | 4-218523 | | 8/1992 |
| JP | 08073563 | * | 3/1996 |
| JP | 9-77850 | | 3/1997 |
| JP | 10-195179 | | 7/1998 |

OTHER PUBLICATIONS

Computer Translation of JP 08073563, Oct. 2001.*
Chemical Abstracts, Reg File, Printout I, 2001.*
Chemical Abstracts, Reg. File, Printout II, 2001.*
Chemical Abstracts, Reg. File Printout III, 2001.*

* cited by examiner

Primary Examiner—Robert Dawson
Assistant Examiner—D. Aylward
(74) Attorney, Agent, or Firm—Schnader Harrison Segal & Lewis LLP

(57) ABSTRACT

An epoxy resin comprising (A) an epoxy resin, (B) a curing agent and (C) a filler, in which the epoxy resin (A) contains a bisphenol F-type epoxy compound (a), the filler (C) contains spherical silica and the filler (C) accounts for from 88 to 96% by weight of the resin composition, has good soldering heat resistance enough for high-temperature solder reflow and has good moldability. A semiconductor device encapsulated with the resin composition is useful for use in electronic appliances.

7 Claims, No Drawings

EPOXY RESIN COMPOSITION AND SEMICONDUCTOR DEVICE

TECHNICAL FIELD

The present invention relates to an epoxy resin composition of good moldability and high reliability favorable for semiconductor encapsulation, and also to a semiconductor device.

BACKGROUND OF THE INVENTION

Epoxy resins have good heat resistance, moisture resistance, electrical properties and adhesiveness, and, when combined with various additives, they can be formulated into different types of compositions having desired properties. Therefore, they are utilized for industrial materials including paints, adhesives, electric insulators, etc.

For sealing and encapsulating electronic circuit members of semiconductor devices and others, for example, hermetic sealing with metals or ceramics as well as resin encapsulation with phenol resins, silicone resins or epoxy resins has heretofore been proposed. Resins usable for such semiconductor encapsulation are generally referred to as sealant resins. Above all, resin encapsulation with epoxy resins is the most popular in the art, in view of the balance of their economical advantages, productivity and physical properties. In general, a transfer-molding process is employed for sealing and encapsulating semiconductor chips with epoxy resins. Briefly, a curing agent, a filler and other additives are added to an epoxy resin, and the resulting composition is applied to semiconductor chips aligned in a mold.

The necessary characteristics of epoxy resin compositions for semiconductor encapsulation are high reliability and good moldability. For their reliability, for example, the resin compositions must be resistant to moisture; and for their moldability, the resin compositions must be flowable and must be softened when heated, and must not form burrs when molded.

The moisture resistance referred to herein is meant to indicate that, when resin-sealed semiconductors are left in high-temperature high-humidity environments, no moisture penetrates into the sealant resin and into the interface between the sealant resin and the resin-sealed lead frame to damage the semiconductors. The degree of integration of semiconductors is increasing these days, and the sealant resins for semiconductors are desired to have higher moisture resistance.

For improving the moisture resistance of sealant resins, a silane coupling agent is generally added to them. Concretely, a method of adding an epoxy silane to sealant resins (Japanese Patent Publication No. 17640/1987); a method of adding a mercaptosilane thereto (Japanese Patent Laid-Open No. 153357/1980); and a method of adding thereto an aminosilane having a secondary amino group (Japanese Patent Laid-Open No. 218736/1990) have been proposed.

A method of increasing the purity of sealant resins by removing impurities from epoxy resin, curing agents and other constituent components to thereby improve the moisture resistance of the thus-purified sealant resins has also been proposed (Japanese Patent Laid-Open No. 212224/1982).

The recent technology for mounting semiconductor packages on a printed circuit board is toward automatic high-density package mounting, for which the surface mount technology (SMT) of directly soldering semiconductor packages on the surface of a substrate is being popular in place of the conventional plated through-hole (PTH) mount technology of inserting lead pins into the through-holes of a substrate. With that, the semiconductor packages to be mounted on a substrate range from conventional dual in-line packages (DIP) to thin-film flat plastic packages (FPP) suitable for high-density surface mounting. Above all, TSOP, TQFP and LQFP having a thickness of at most 2 mm are the mainstreams for the recent FPP, as meeting the advanced microfabrication in the art. In that situation, they are more readily influenced by external factors such as temperature and humidity, and their reliability including soldering heat resistance, high-temperature reliability and heat-resistance reliability will be a matter of greater importance.

Solder reflow surface mounting is generally employed for SMT. The method comprises putting semiconductor packages on a substrate followed by exposing them to a high temperature not lower than 200° C. so that the solder previously applied onto the substrate is melted to thereby fix the packages on the surface of the substrate. In the surface-mounting method, the semiconductor packages are entirely exposed to such a high temperature. In this case, if the moisture resistance of the sealant resin used in the packages is not good, the moisture absorbed by the resin will explosively expand while the packages are heated at such a high temperature for solder reflow, and the package will be cracked. Therefore, the moisture resistance of sealant resins for semiconductor encapsulation is a matter of great importance.

For protecting the environment, the recent tendency in the art is toward using lead-free solder. The melting point of lead-free solder is high, and therefore the reflow temperature thereof is also high. In that situation, sealant resins for semiconductor encapsulation are desired to have higher soldering heat resistance and higher moisture resistance than before.

It is generally known that increasing the proportion of a filler in a sealant resin effectively results in enhancing the soldering heat resistance of the resin. This is because the resin component of the sealant resin is reduced whereby the moisture resistance of the sealant resin is enhanced and the moisture absorption thereof decreases. However, this is problematic in that, if the proportion of the filler in a sealant resin is larger than 90% by weight, the fluidity of the sealant resin greatly lowers, thereby causing other problems of package encapsulation failure and stage shifts. In addition, the reduction in the resin component in a sealant resin causes still other problems of resin-to-lead frame adhesion failure and package peeling in reflow treatment.

The object of the present invention is to solve the problems with epoxy resin compositions noted above and to provide a resin composition having the advantages of improved reliability including soldering heat resistance, improved moldability including fluidity, and improved reflow resistance to ensure good adhesion to lead frames, thereby enabling resin encapsulation of semiconductors at higher solder reflow temperatures.

DISCLOSURE OF THE INVENTION

The invention provides an epoxy resin composition comprising (A) an epoxy resin, (B) a curing agent and (C) a filler, which is characterized in that the epoxy resin (A) contains an epoxy compound (a) of chemical formula (I) mentioned below, that the filler (C) contains spherical silica and that the filler (C) accounts for from 88 to 96% by weight of the entire resin composition, and provides a semiconductor device.

BEST MODES OF CARRYING OUT THE INVENTION

The constitution of the invention is described in detail hereinunder.

In the invention, the epoxy resin (A) contains, as the essential ingredient, a bisphenol F-type epoxy resin (a) of formula (I) mentioned below. Containing the bisphenol F-type epoxy resin (a), the viscosity of the sealant resin of the composition lowers and the moldability thereof greatly improves. Preferably, the content of the bisphenol F-type epoxy resin (a) falls between 50 and 100% by weight of the epoxy resin (A).

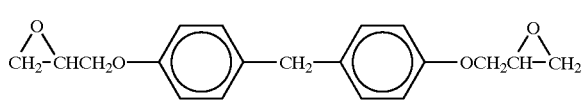

(I)

Depending on its use, the resin composition may contain two or more different types of epoxy resins. For good heat resistance enough for semiconductor encapsulation, however, it is desirable that the resin composition contains any of cresol-novolak-type epoxy resins and bishydroxybiphenyl-type epoxy resins having an epoxy equivalent of at most 500, preferably at most 300.

In the invention, the proportion of the epoxy resin (A) preferably falls between 2.5 and 5.0% by weight of the entire resin composition.

The curing agent (B) for use in the invention is not specifically defined, so far at it reacts with and cures the epoxy resin (A). Concretely, it includes, for example, novolak resins such as phenol-novolak, cresol-novolak, etc.; bisphenol compounds such as biphenol A, etc.; acid anhydrides such as maleic anhydride, phthalic anhydride, pyromellitic anhydride, etc.; aromatic amines such as metaphenylenediamine, diaminodiphenylmethane, diaminodiphenylsulfone, etc. Above all, preferred are novolak resins such as phenol-novolak and cresol-novolak, as having good heat resistance, moisture resistance and storage stability enough for semiconductor package encapsulation. Especially preferred are aralkyl-type curing agents of chemical formula (II). Depending on its use, the resin composition may contain two or more different types of curing agents.

For example, it includes imidazole compounds such as 2-methylimidazole, 2,4-dimethylimidazole, 2-ethyl-4-methylimidazole, 2-phenylimidazole, 2-phenyl-4-methylimidazole, 2-heptadecylimidazole, etc.; tertiary amine compounds such as triethylamine, benzyldimethylamine, α-methylbenzylmethylamine, 2-(dimethylaminomethyl)phenol, 2,4,6-tris(dimethylaminomethyl)phenol, 1,8-diazabicyclo(5,4,0)undecene-7, etc.; organometallic compounds such as zirconium tetramethoxide, zirconium tetrapropoxide, tetrakis(acetylacetonato)zirconium, tri(acetylacetonato)aluminium, etc.; organophosphine compounds such as triphenylphosphine, trimethylphosphine, triethylphosphine, tributylphosphine, tri(p-methylphenyl)phosphine, tri(nonylphenyl)phosphine, etc. Above all, preferred are organophosphine compounds as ensuring good reliability and moldability; and more preferred is triphenylphosphine.

Depending on its use, the resin composition may contain two or more such curing promoters. Preferably, the amount of the curing promoter that may be in the resin composition falls between 0.1 and 10 parts by weight relative to 100 parts by weight of the epoxy resin (A) therein.

The filler (C) in the resin composition of the invention must contain spherical silica. With the increase in the proportion of the filler (C) therein, the moldability including the fluidity of the resin composition will worsen. However, the spherical filler prevents the reduction in the fluidity of the resin composition containing it. Depending on its use, the resin composition may contain two or more different types of fillers. For the fillers that may be combined with spherical silica, preferred are inorganic fillers including, for example, fused silica, crystalline silica, calcium carbonate, magnesium carbonate, alumina, magnesia, clay, talc, calcium silicate, titanium oxide, asbestos, glass fibers, etc.

In the invention, the proportion of the filler (C) must fall between 88 and 96% by weight of the entire resin composition. If the content of the filler (C) is smaller than 88% by weight, the water absorption of the resin composition will increase, and the soldering heat resistance thereof will be poor. On the other hand, if it is larger than 96% by weight, the adhesiveness and the package-encapsulating ability of the resin composition will be poor. Preferably, the proportion of the filler (C) is higher than 92% by weight but not higher than 96% by weight, for ensuring the application of the resin composition even to reflow treatment with lead-free solder of which the reflow temperature will be around 260° C.

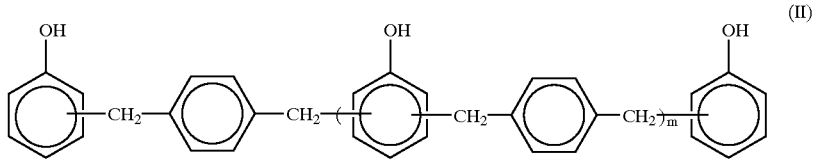

(II)

Preferably, the proportion of the curing agent (B) falls between 2.5 and 5.0% by weight of the entire resin composition. Also preferably, the ratio of the curing agent (B) to the epoxy resin (A) falls between 0.5 and 1.3, more preferably between 0.6 and 1.0, in terms of the chemical equivalent ratio of (B) to (A), as ensuring good mechanical properties and moisture resistance of the resin composition.

In the invention, optionally used is a curing promoter that promotes the curing reaction between the epoxy resin (A) and the curing agent (B). The curing promoter is not specifically defined, so far as it promotes the curing reaction.

Since the proportion of the inorganic component therein is high, the sealant resin composition of the invention is highly resistant to flames and ensures high flame retardancy even though not containing a flame retardant used in conventional sealant resins. Accordingly, the sealant resin composition of the invention does not require a halogen component generally used in conventional flame retardants, and is therefore favorable for environmental protection.

Regarding the particle size distribution of the filler (C) to be in the resin composition of the invention, it is desirable that the filler (C) contains from 4 to 7% by weight of particles not larger than 1 μm and contains from 20 to 23% by weight of particles not smaller than 30 μm. Having the defined particle size distribution, the filler (C) will greatly improve the fluidity of the sealant resin composition Preferably, the resin composition of the invention contains a silane coupling agent (D). The silane coupling agent (D) may be any known one, for which, however, preferred are amino group-containing silane compounds (d) in which the amino groups are all secondary amino groups. Specific examples of such amino group-containing silane compounds (d) in which the amino groups are all secondary amino groups are compounds of the following formulae (III) and (IV):

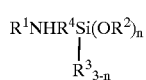
(III)

wherein $R^1$, $R^2$ and $R^3$ each represent a monovalent hydrocarbon group having from 1 to 30 carbon atoms; $R^4$ represents a divalent hydrocarbon group having from 1 to 20 carbon atoms; and n indicates an integer of from 1 to 3.

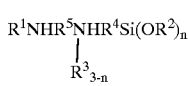
(IV)

wherein $R^1$, $R^2$ and $R^3$ each represent a monovalent hydrocarbon group having from 1 to 30 carbon atoms; $R^4$ and $R^5$ each represent a divalent hydrocarbon group having from 1 to 20 carbon atoms; and n indicates an integer of from 1 to 3.

Especially preferred are silane compounds (d) of formulae (III) and (IV) in which $R^1$ is a phenyl group, $R^2$ and $R^3$ each are a methyl group and/or an ethyl group, $R^4$ is a propylene group, and n is 2 or 3, since their ability to improve the moldability and the reliability of the resin composition is high and since the fluidity of the resin composition containing any of them is good.

In view of the moldability and the reliability of the resin composition, the amount of the silane coupling agent (D) in the resin composition may fall generally between 0.1 and 5 parts by weight, but preferably between 0.2 and 3 parts by weight, more preferably between 0.3 and 1.5 parts by weight, relative to 100 parts by weight of the filler therein. Preferably, the filler (C) is previously subjected to surface treatment with the silane coupling agent (D), for further improving the reliability, the adhesiveness and the fluidity of the resin composition.

The epoxy resin composition of the invention may optionally contain any colorants such as carbon black, iron oxide, etc.; elastomers such as silicone rubber, styrene-based block copolymers, olefin-based polymers, modified nitrile rubber, modified polybutadiene rubber, etc.; thermoplastic resins such as polystyrene, etc.; coupling agents such as titanate coupling agents, etc.; lubricants such as long-chain fatty acids, metal salts of long-chain fatty acids, esters of long-chain fatty acids, amides of long-chain fatty acids, paraffin wax, etc.; crosslinking agents such as organic peroxides, etc.

Preferably, the epoxy resin composition of the invention is prepared by melting and kneading the constituent components. For preparing it, any known melting and kneading method is employable. For example, the epoxy resin composition may be prepared by melting and kneading the constituent components in a Banbury mixer, a kneader, a roll, a single-screw or double-screw extruder, a cokneader or the like.

EXAMPLES

The invention is described concretely with reference to the following Examples, in which % are by weight.

The constituent components used herein and their blend ratio are mentioned below.

<Epoxy Resin I>

This is a bis-F-type epoxy resin of the following chemical formula (I), and its blend ratio is shown in Table 1.

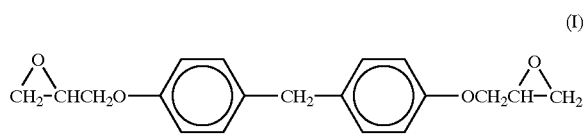
(I)

<Epoxy Resin II>

This is 4,4'-bis(2,3-epoxypropoxy)-3,3',5,5'-tetramethylbiphenyl, and its blend ratio is shown in Table 1.

<Epoxy Resin III>

This is 4,4'-bis(2,3-epoxypropoxy)biphenyl, and its blend ratio is shown in Table 1.

<Epoxy Resin IV>

This is a bis-F-type epoxy resin of the following chemical formula (V), and its blend ratio is shown in Table 1.

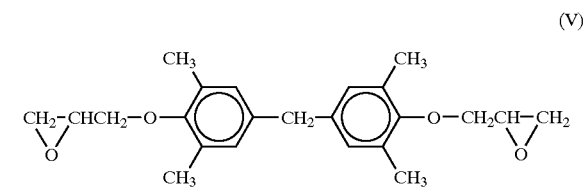
(V)

<Curing Agent I>

This is a phenol compound of the following chemical formula (II), and its blend ratio is shown in Table 1.

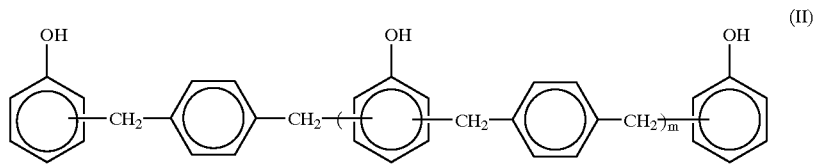
(II)

(This contains about 90% by weight of the compound where m falls between 1 and 3.)

<Curing Agent II>

This is a phenol-novolak resin having a hydroxyl equivalent of 107, and its blend ratio is shown in Table 1.

<Inorganic Filler>

This is amorphous spherical fused silica of which the particle size distribution is such that the particles not larger than 1 μm account for 7% by weight and those not smaller than 30 μm account for 21% by weight, and its blend ratio is shown in Table 1.
<Silane Coupling Agent>
This is N-phenylaminopropyltrimethoxysilane, and its blend ratio is shown in Table 1.
The silane coupling agent is previously mixed with the inorganic filler.
<Curing Promoter>
This is triphenylphosphine, and its blend ratio is 0.1% by weight.
<Colorant>
This is carbon black, and its blend ratio is 0.2% by weight.
<Lubricant>
This is carnauba wax, and its blend ratio is 0.3% by weight. Examples 1 to 5, Comparative Examples 1 to 6:
Using a mixer, the constituent components were blended in dry indifferent compositional ratios shown in Table 1. The resulting mixtures were separately kneaded under heat for 5 minutes by the use of a mixing roll having a roll surface temperature of 90° C., then cooled, and ground to prepare epoxy resin compositions for semiconductor encapsulation.

TABLE 1

|  | Epoxy Resin (wt. %) | | | | Curing Agent (wt. %) | | Filler (wt. %) | Silane Coupling Agent (wt. %) |
| --- | --- | --- | --- | --- | --- | --- | --- | --- |
|  | I | II | III | IV | I | II |  |  |
| Example 1 | 2.1 | 2.1 |  |  | 3.7 |  | 91 | 0.5 |
| Example 2 | 1.6 | 1.6 |  |  | 2.7 |  | 93 | 0.5 |
| Example 3 | 1.1 | 1.1 |  |  | 1.7 |  | 95 | 0.5 |
| Example 4 | 2.3 |  |  |  | 1.6 |  | 95 | 0.5 |
| Example 5 | 1.9 | 1.9 |  |  |  | 2.1 | 93 | 0.5 |
| Comp. Example 1 | 3.1 | 3.1 |  |  | 5.7 |  | 87 | 0.5 |
| Comp. Example 2 | 0.5 | 0.5 |  |  | 0.9 |  | 97 | 0.5 |
| Comp. Example 3 |  |  | 2.8 |  | 3.1 |  | 93 | 0.5 |
| Comp. Example 4 |  |  | 1.5 | 1.5 | 2.9 |  | 93 | 0.5 |
| Comp. Example 5 |  |  |  | 2.8 | 3.1 |  | 93 | 0.5 |
| Comp. Example 6 | 3.8 | 3.8 |  |  |  | 4.3 | 87 | 0.5 |

Each resin composition was tested for encapsulating 160-pin QFQ (quad flat package) according to a low-pressure transfer molding process. The package mounted on a substrate is composed of Al-plated dummy chips having a size of 12×12 mm. The molding temperature is 175° C., and the curing time is 2 minutes. The thus-encapsulated packages were post-cured at 180° C. for 5 hours. The samples were tested according to the following test methods to evaluate the properties of the resin compositions. Unless otherwise specifically indicated, the molding temperature is 175° C., the curing time is 2 minutes, the post-curing temperature is 180° C., and the post-curing time is 5 hours.

Soldering Heat Resistance:
Twenty samples of 160-pin QFP fabricated in the manner as above are exposed to moisture at 85° C./85% RH for 168 hours, and heated in an IR reflow furnace (its highest temperature is 245° C.) for 2 minutes. The number of the samples with external cracks is counted.

High-temperature Soldering Heat Resistance:
The test for this is the same as that for the soldering heat resistance mentioned above, except that the highest temperature of the IR reflow furnace is 260° C.

Adhesiveness:
Twenty samples of 160-pin QFP fabricated in the manner as above are exposed to moisture at 85° C./85% RH for 168 hours, and heated in an IR reflow furnace (its highest temperature is 245° C.) for 2 minutes. The condition of the silver-plated part of the lead frame of each sample is checked with an ultrasonic flaw detector (Hitachi Kenki's mi-scope 10), and the number of the samples with peeled flaws is counted.

Water Absorption:
Twenty samples of 160-pin QFP fabricated in the manner as above are individually weighed in dry. They are exposed to moisture at 85° C./85% RH for 168 hours, and individually weighed. From the dry weight and the wet weight of each sample, the water absorption (%) of the sample is obtained. The data in Table 2 are the mean value of 20 samples thus tested.

Package Encapsulation:
Each sample of 160-pin QFP fabricated in the manner as above is macroscopically and microscopically checked for the presence or absence of encapsulation failures and voids.

Flame Retardancy Test:
Combustion test pieces of 5"×½"×¹⁄₁₆" are molded and post-cured, and tested for flame retardancy according to the UL94 Standard.

The test data are given in Table 2. As in this table, the samples of the epoxy resin composition of the invention all have the advantages of good soldering heat resistance, good high-temperature soldering heat resistance, good adhesiveness, good package encapsulation and good flame retardancy.

TABLE 2

|  | Soldering Heat Resistance (number of samples with external cracks) | High-temperature Soldering Heat Resistance (number of samples with external cracks) | Adhesiveness (number of samples with peeled flaws) | PKG Encapsulation | Water Absorption | Flame Retardancy (UL94) |
| --- | --- | --- | --- | --- | --- | --- |
| Example 1 | 0/20 | 4/20 | 0/20 | good | 0.24 | V-0 |
| Example 2 | 0/20 | 2/20 | 0/20 | good | 0.15 | V-0 |
| Example 3 | 0/20 | 0/20 | 0/20 | good | 0.11 | V-0 |
| Example 4 | 0/20 | 0/20 | 0/20 | good | 0.13 | V-0 |
| Example 5 | 0/20 | 5/20 | 1/20 | good | 0.15 | V-0 |
| Comp. Example 1 | 5/20 | 20/20 | 20/20 | good | 0.29 | V-1 |
| Comp. Example 2 | 3/20 | 5/20 | 20/20 | voids and encapsulation failures found | 0.09 | V-0 |

TABLE 2-continued

| | Soldering Heat Resistance (number of samples with external cracks) | High-temperature Soldering Heat Resistance (number of samples with external cracks) | Adhesiveness (number of samples with peeled flaws) | PKG Encapsulation | Water Absorption | Flame Retardancy (UL94) |
|---|---|---|---|---|---|---|
| Comp. Example 3 | 5/20 | 10/20 | 10/20 | voids and encapsulation failures found | 0.12 | V-0 |
| Comp. Example 4 | 8/20 | 13/20 | 20/20 | voids found | 0.10 | V-0 |
| Comp. Example 5 | 5/20 | 15/20 | 8/20 | voids and encapsulation failures found | 0.14 | V-0 |
| Comp. Example 6 | 8/20 | 20/20 | 20/20 | good | 0.29 | V-2 |

As opposed to the samples of the invention, the water absorption of the samples of Comparative Examples 1 and 6 in which the proportion of the filler is small is high, the high-temperature soldering heat resistance and the adhesiveness thereof are poor, and the flame retardancy thereof is not good. The package encapsulation with the samples of Comparative Example 2 in which the proportion of the filler is large is not good, and the adhesiveness of the samples is extremely poor. The package encapsulation with the samples of Comparative Examples 3, 4 and 5 in which the epoxy resin is not the bisphenol F-type epoxy resin of formula (I) is not good, and the adhesiveness of the samples is extremely poor.

The test results verify the superiority of the epoxy resin composition of the invention in which the epoxy resin is the one defined herein and the proportion of the filler falls within the range defined herein.

INDUSTRIAL APPLICABILITY

As described hereinabove, the epoxy resin composition of the invention for semiconductor encapsulation, in which the essential epoxy resin component is the one specifically defined herein and the proportion of the filler falls within the defined range of from 88 to 96% by weight, has good soldering heat resistance and moldability enough for high-temperature solder reflow. Using this, reliable semiconductor devices can be fabricated.

What is claimed is:

1. A epoxy resin composition comprising (A) an epoxy resin, (B) a curing agent and (C) a filler, which is characterized in that the epoxy resin (A) contains a bisphenol F-type epoxy compound (a) of the following chemical formula (I), that the filler (C) contains spherical silica:

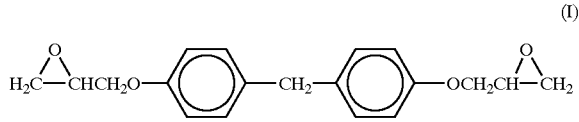

(I)

wherein the proportion of the filler (C) is higher than 92% by weight but not higher than 96% by weight of the entire resin composition.

2. The epoxy resin composition as claimed in claim 1, which further contains a silane coupling agent (D).

3. The epoxy resin composition as claimed in claim 1, wherein the curing agent (B) contains a curing agent (b) of the following chemical formula (II) in an amount of about 90% by weight of the compound with m falling between 1 and 3:

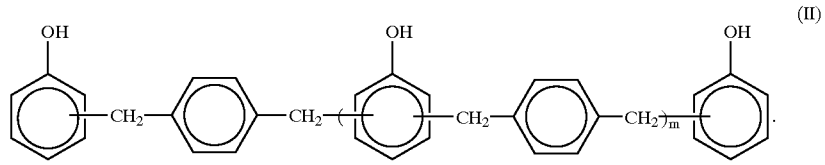

(II)

4. The epoxy resin composition as claimed in claim 2, wherein the silane coupling agent (D) contains an amino group-containing silane compound (d) of the following chemical formula (III) or (IV) in which the amino groups are all secondary amino groups:

(III)

wherein $R^1$, $R^2$ and $R^3$ each represent a monovalent hydrocarbon group having 1 to 30 carbon atoms; $R^4$ represents a divalent hydrocarbon group having from 1 to 20 carbon atoms; and n indicates an integer of from 1 to 3;

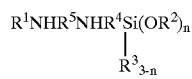

(IV)

5. The epoxy resin composition as claimed in claim 1, wherein the particle size distribution of the filler (C) is such that particles not larger than 1 μm account for from 4 to 7% by weight and those not smaller than 30 μm account for from 20 to 23% by weight.

6. The epoxy resin composition as claimed in claim 1, wherein the proportion of bromine compounds and that of antimony compounds therein are both not higher than 0.03% by weight of the resin entire composition, and that the flame retardancy of the combustion test pieces formed of the epoxy resin composition to have a thickness of not larger than 1/16 inches, evaluated according to the UL94 Standard, is V–0.

7. A semiconductor device encapsulated with the epoxy resin composition of any of claims 1 to 5 and 6.

* * * * *